(12) United States Patent
Huang et al.

(10) Patent No.: US 11,304,332 B2
(45) Date of Patent: Apr. 12, 2022

(54) ELECTRONIC DEVICE

(71) Applicant: PEGATRON CORPORATION, Taipei (TW)

(72) Inventors: Ying-Yen Huang, Taipei (TW); Shu-Fang Chueh, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 17/120,984

(22) Filed: Dec. 14, 2020

(65) Prior Publication Data

US 2021/0204441 A1 Jul. 1, 2021

(30) Foreign Application Priority Data

Dec. 30, 2019 (TW) ................................. 108148303

(51) Int. Cl.
*G06F 1/16* (2006.01)
*H05K 5/00* (2006.01)
*H05K 7/00* (2006.01)
*H05K 7/20* (2006.01)

(52) U.S. Cl.
CPC ....... *H05K 7/20163* (2013.01); *H05K 7/2019* (2013.01)

(58) Field of Classification Search
CPC .............. H05K 7/2019; H05K 7/20163; G06F 1/1662; G06F 1/1664; G06F 1/1667
See application file for complete search history.

(56) References Cited

U.S. PATENT DOCUMENTS

| 6,577,502 B1* | 6/2003 | DiStefano | G06F 1/1616 |
| | | | 361/679.46 |
| 10,078,351 B1* | 9/2018 | Chang | G06F 1/1616 |
| 2009/0167691 A1* | 7/2009 | Wang | G06F 1/1667 |
| | | | 345/168 |
| 2010/0165567 A1* | 7/2010 | Shih | G06F 1/1667 |
| | | | 361/679.48 |
| 2010/0214743 A1* | 8/2010 | Huang | G06F 1/1616 |
| | | | 361/692 |
| 2010/0220439 A1* | 9/2010 | Qin | G06F 1/1667 |
| | | | 361/679.47 |

(Continued)

FOREIGN PATENT DOCUMENTS

| KR | 20070000377 | 1/2007 |
| TW | 201232234 | 8/2012 |
| TW | 201508454 | 3/2015 |

(Continued)

*Primary Examiner* — Anthony M Haughton
(74) *Attorney, Agent, or Firm* — J.C. Patents (57) ABSTRACT

An electronic device includes a main body, a case, and an airbag. The main body includes an accommodation space and an opening, and a fan is disposed in the accommodation space. The case is disposed on the opening and one side of the case is connected to one side wall of the main body surrounding the opening. The airbag is disposed in the accommodation space below the orthographic projection of the case and communicates with the fan. When the airbag is not yet inflated, the case horizontally covers the opening. When the fan rotates at a speed greater than a critical speed, the airbag is inflated by the fan to lift another side of the case, so that the case is tilted on the main body to expose the opening.

11 Claims, 9 Drawing Sheets

(56) References Cited

U.S. PATENT DOCUMENTS

2012/0127652 A1\* 5/2012 Lin .................. G06F 1/203
                                                            361/679.46
2020/0183451 A1\* 6/2020 Lin .................. G06F 1/1616

FOREIGN PATENT DOCUMENTS

| WO | 2009043240 | 4/2009 |
| WO | 2016053247 | 4/2016 |

\* cited by examiner

ELECTRONIC DEVICE

CROSS-REFERENCE TO RELATED APPLICATION

This application claims the priority benefit of Taiwan application serial no. 108148303, filed on Dec. 30, 2019. The entirety of the above-mentioned patent application is hereby incorporated by reference herein and made a part of this specification.

BACKGROUND

Technology Field

The disclosure relates to an electronic device, and more particularly to an electronic device with good heat dissipation.

Description of Related Art

For electronic devices such as laptops, the thinner design for laptops is currently the trend. However, because the space inside the body is too small to particularly reserve space for heat dissipation, the continuous increase in heat energy inside the system may affect the lifetime of the electronic components. In addition, in some models, the palm rest of the housing next to the keyboard is used to dissipate heat, but the temperature increase in the palm rest affects the user comfort in operating the electronic device. Moreover, if the frequency of the processor is reduced in order to reduce the operating temperature, this causes the user to have a bad experience of the operation.

SUMMARY

The disclosure provides an electronic device, which is applied to a thin structure and capable of having a good effect of heat dissipation without reducing the frequency.

An electronic device in the disclosure includes a main body, a case, and an airbag. The main body includes an accommodation space and an opening and includes a fan disposed in the accommodation space. The case is disposed on the opening, and one side of the case is connected to one of side walls of the main body surrounding the opening, and the accommodation space is below an orthographic projection of the case. The airbag is disposed in the accommodation space and connected to the fan. When the airbag is not inflated, the case horizontally covers the opening. When the fan rotates at a speed greater than a critical speed, the airbag is inflated by the fan and lifts another side of the case, so that the case is tilted on the main body, and the opening is exposed.

In an embodiment of the disclosure, the airbag includes ring structures with multiple layers, and the multiple layers are interconnected to one another.

In an embodiment of the disclosure, the airbag includes a center structure disposed in the ring structures with the multiple layers, and the multiple layers are interconnected to the center structure.

In an embodiment of the disclosure, the fan includes a retaining wall, and a primary channel and a secondary channel separated by the retaining wall, and the airbag communicates with the secondary channel.

In an embodiment of the disclosure, the fan further includes a housing and a door panel pivotally connected to the housing. The door panel is disposed beside the secondary channel. When the airbag is deflated, the door panel is adapted to be opened to allow the air from the airbag to flow out.

In an embodiment of the disclosure, when the case is tilted on the main body to expose the opening, the airflow of the fan flows out of the opening.

In an embodiment of the disclosure, the airbag includes an air inlet valve, and the electronic device further includes an air conveyor belt connected between the air inlet valve of the airbag and the fan.

In an embodiment of the disclosure, the electronic device further includes a secondary body pivotally connected to the main body, and when the secondary body is closed on the main body, the case covers the opening.

In an embodiment of the disclosure, the material of the airbag includes a heat-resistant material.

In an embodiment of the disclosure, the material of the airbag is an insulating material.

In an embodiment of the disclosure, when the temperature of the main body is greater than 55° C., the fan rotates at a speed greater than the critical speed.

Based on the above, in the electronic device of the disclosure, the airbag is disposed in the accommodation space below the orthographic projection of the case and is connected to the fan. When the fan rotates at a speed less than the critical speed, the fan is capable of reaching sufficient heat dissipation, the air bag has not been inflated, and the case horizontally covers the opening. When the fan rotates at a speed greater than a critical speed, the airbag is inflated by the fan to lift a side of the case, so that the case is tilted on the main body to expose the opening. Meanwhile, the gap between the opening and the case and the main body serves as the inlet and outlet of the air flow to help the outflow of high-temperature air, or the entry of external cold air for cooling.

DESCRIPTION OF THE EMBODIMENTS

Generally, when an electronic device is operating at a low load, the fan is able to dissipate the heat generated by the electronic device. However, when the electronic device is operating at a medium to high load, the fan may not dissipate the heat generated by the electronic device well, resulting in heat accumulation. To prevent the above situation, the electronic device in the embodiment adopts an airbag to lift the case to create an air outlet, thereby improving the heat dissipation. Illustration with respect to this is as follows.

Figure 1:
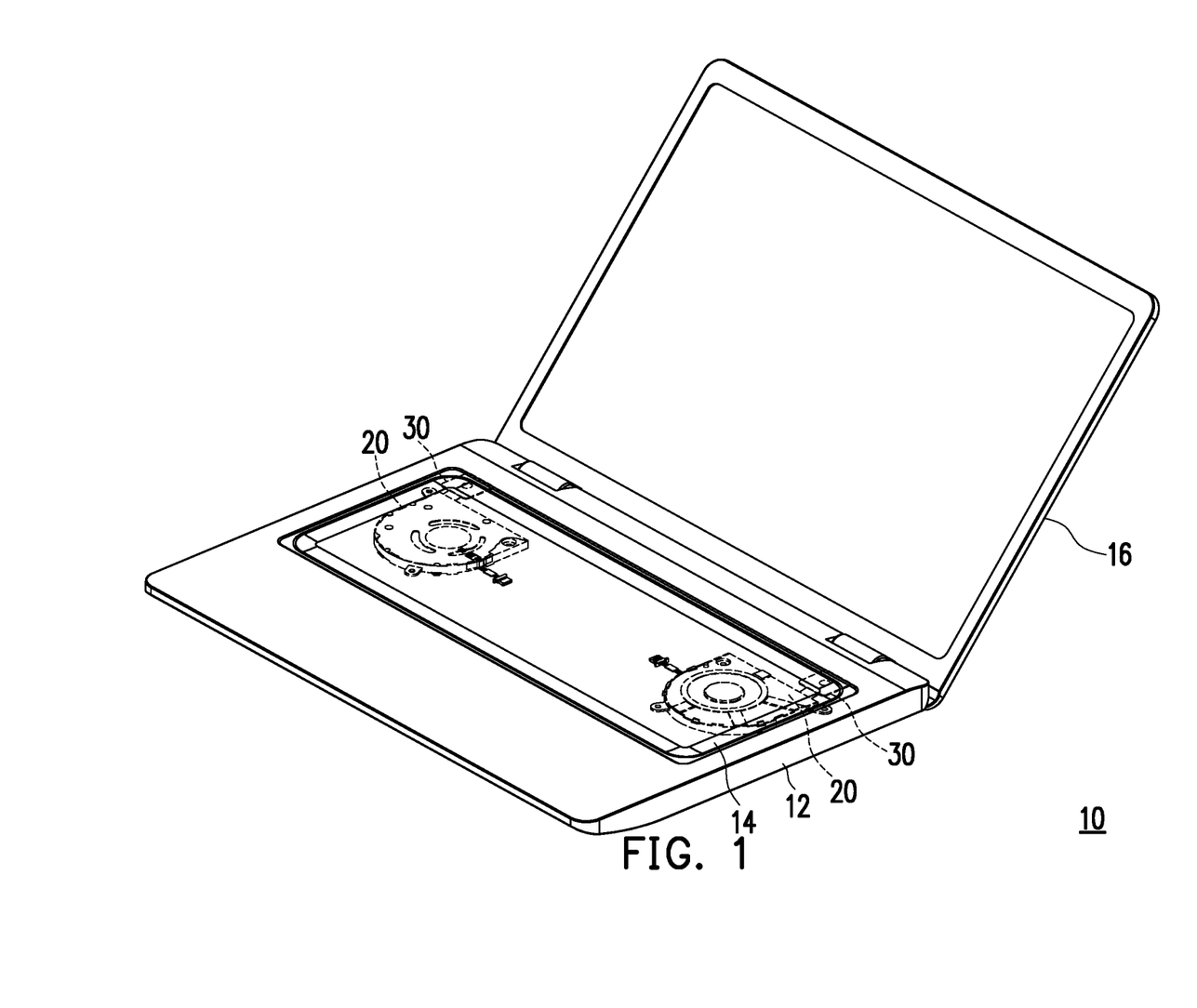
FIG. 1 is a three-dimensional schematic view of an electronic device according to an embodiment of the disclosure.
Figure 2:
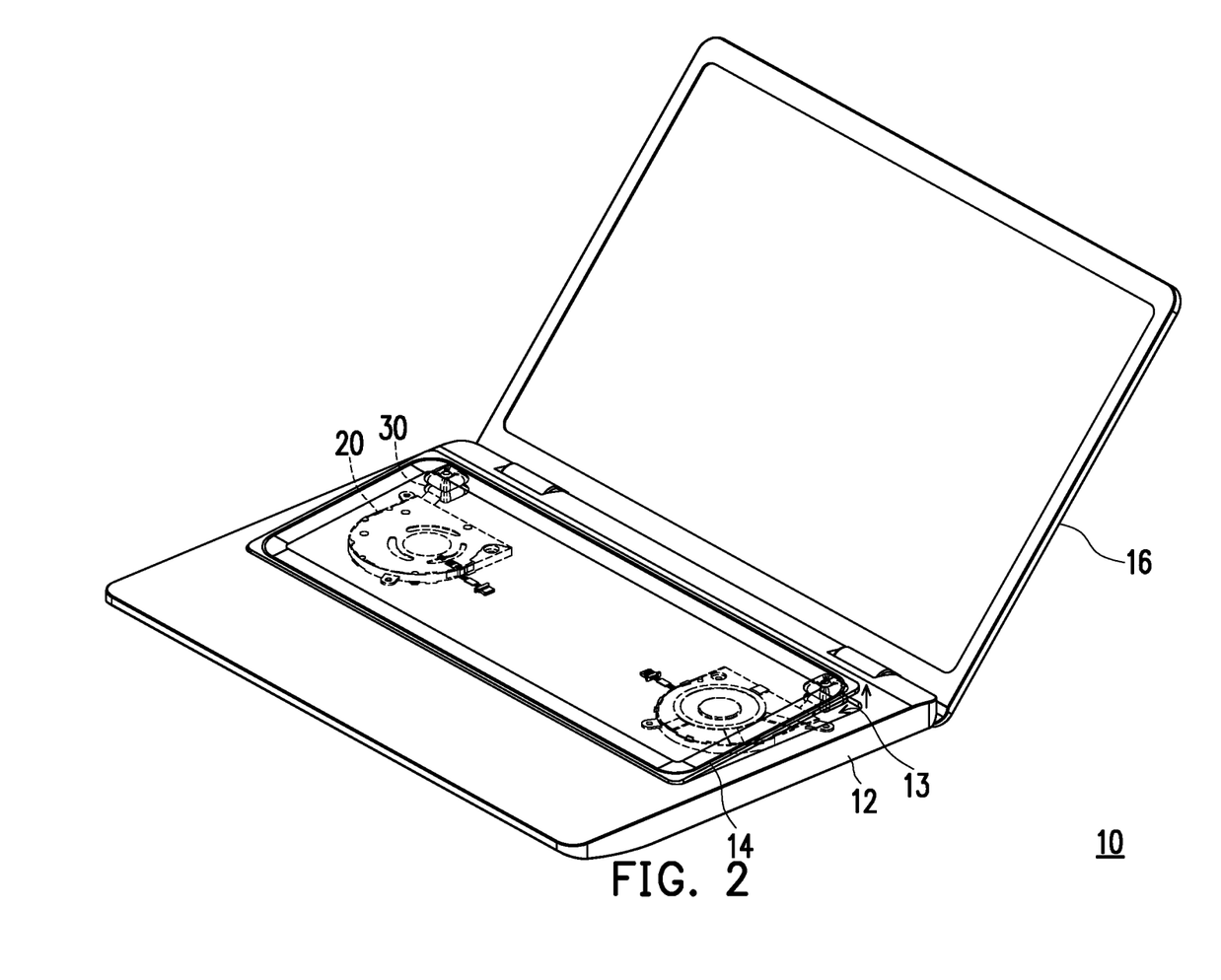
FIG. 2 is a three-dimensional schematic view of the electronic device of FIG. 1 when the case is lifted.
Figure 3:
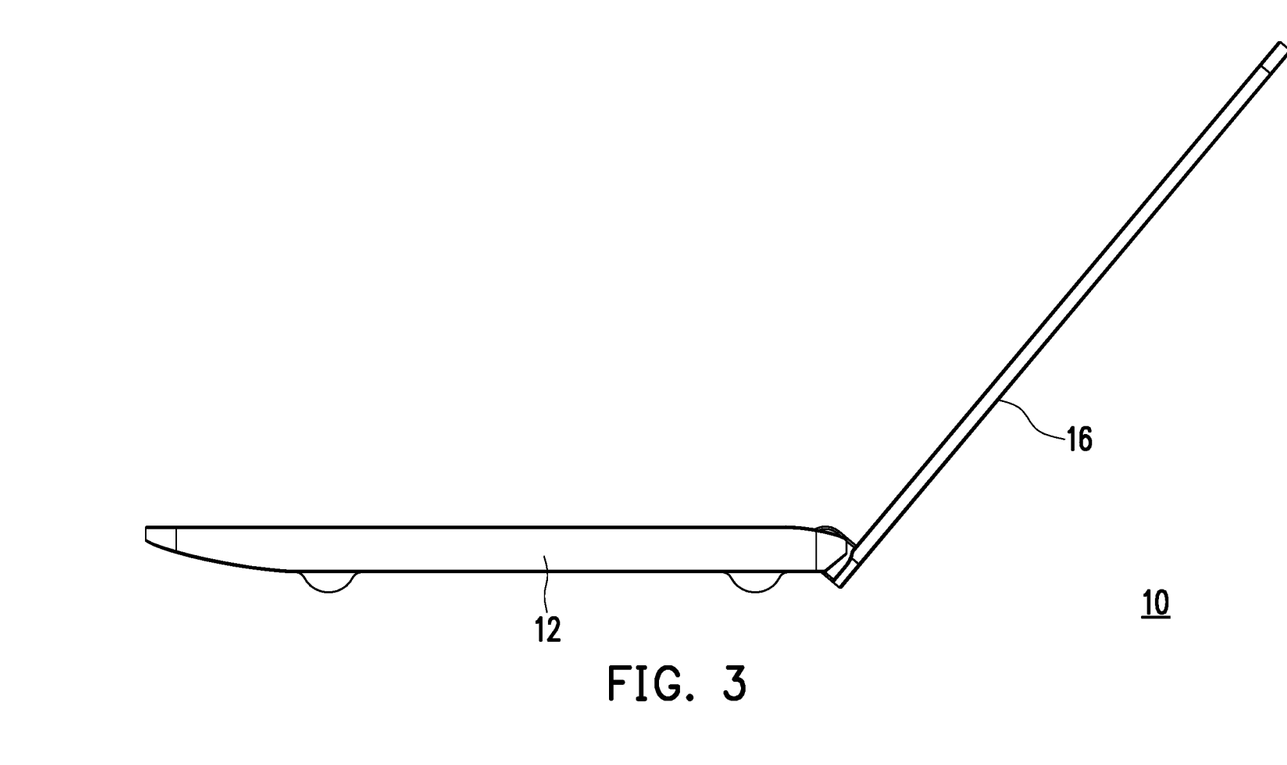
FIG. 3 is a schematic side view of FIG. 1.
Figure 4:
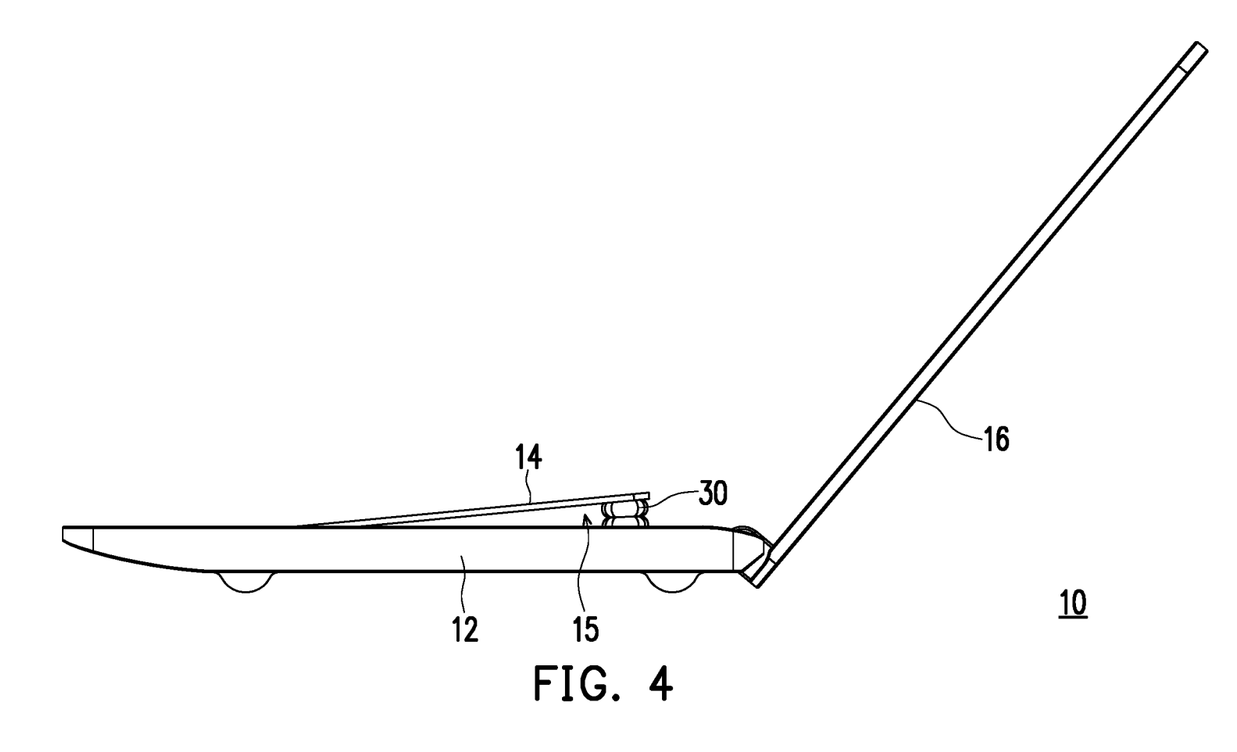
FIG. 4 is a schematic side view of FIG. 2.

FIG. 1 is a three-dimensional schematic view of an electronic device according to an embodiment of the disclosure. FIG. 2 is a three-dimensional schematic view of the electronic device of FIG. 1 when the case is lifted. FIG. 3 is a schematic side view of FIG. 1. FIG. 4 is a schematic side view of FIG. 2.

Referring to FIG. 1 to FIG. 4, an electronic device 10 in the embodiment includes a main body 12, a case 14, and an airbag 30. In the embodiment, the electronic device 10 further includes a secondary body 16 pivotally connected to the main body 12. The electronic device 10 is, for example, a laptop. Alternatively, in other embodiments, the electronic device 10 may have only a single body or other types of electronic devices 10.

The main body 12 includes an accommodation space and an opening 13 (see FIG. 2), and the main body 12 includes a fan 20 disposed in the accommodation space. The case 14 is disposed on the opening 13 of the main body 12, and one side of the case 14 is connected to a side wall of the main body 12 surrounding the opening 13. When the secondary body 16 is closed on the main body 12, the case 14 is disposed between the main body 12 and the secondary body 16. In the embodiment, the case 14 is, for example, a housing of a keyboard (not shown), but the type of the case 14 is not limited thereto. The part of the case 14 close to the palm rest (i.e., the part where the wrist of the user rests when typing) is, for example, pivotally connected to the main body 12 through a hinge (not shown), or it may be connected to the main body 12 through a tenon and capable of rotating slightly. Moreover, the manner in which the case 14 is connected to the main body 12 is not limited thereto.

The airbag 30 is disposed between the main body 12 and the case 14 and is connected to the fan 20. More specifically, in the embodiment, the airbag 30 is disposed in the accommodation space below the orthographic projection of the case 14, and the airbag 30 is disposed below the case 14 near the pivot (not shown). The airbag 30 is connected to one side of the main body 12, away from the case 14.

As shown in FIG. 1 and FIG. 3, in the embodiment, when the fan 20 rotates at a speed less than a critical speed, the fan 20 reaches sufficient heat dissipation. Therefore, at this phase, the airbag 30 is not inflated yet, so that the case 14 is horizontally disposed on the main body 12 to cover the opening 13. More specifically, the designer selects the type or the parameters of an air inlet valve 31 (see FIG. 6) according to the air volume of the fan 20 at the critical speed, so that when the fan 20 rotates at a speed less than the critical speed, the air volume provided by the fan 20 towards the airbag 30 is not sufficient to push the air inlet valve 31 of the airbag 30 open and inflates the airbag 30.

As shown in FIG. 2 and FIG. 4, when the usage rate of the central processing unit (not shown) increases, the fan 20 correspondingly rotates at a speed greater than the critical speed. Meanwhile since the fan 20 is capable of supplying more wind (pressurization) to the air inlet valve 31 of the airbag 30, the air inlet valve 31 of the airbag 30 is pushed open by the high-pressure air. In this way, the airbag 30 is inflated by the fan 20 to lift another side of the case, so that the case 14 is tilted on the main body 12 to expose the opening.

Meanwhile, a gap 15 (see FIG. 4) between the opening 13 (see FIG. 2) and the tilted case 14 and the main body 12 serves as an inlet and outlet for airflow. For example, when the airbag 30 is inflated by the fan 20 and is lifted, the case 14 is tilted on the main body 12 to expose the opening 13, and the airflow of the fan 20 is adapted to flow out of the gap 15 between the opening 13 and the case 14 and the main body 12, thereby achieving heat dissipation. Alternatively, the gap 15 between the opening 13 and the case 14 and the main body 12 is adapted to allow external cold air to enter for cooling. In addition, in the embodiment, after the airbag 30 is inflated, the structural strength of the airbag 30 becomes stronger and gets closer to the hard bumper of the case 14 so that the user may type on the keyboard of the case 14 subsequently without affecting the original operation.

Moreover, since the airbag 30 lifts the case 14, the case 14 is farther away from the main body 12, and the case 14 is less likely to touch the heat source (not shown, and e.g. a central processing unit or other chips) inside the case 14 and the main body 12 so that the heat conduction is decreased. The temperature of the case 14 is kept at a lower temperature to prevent the user discomfort. Since the height of the airbag 30 decides how far the side (near the pivot) of the case 14 would be lifted, the designer may select the height of the airbag 30 according to requirements.

Note that when the usage rate of the central processing unit decreases, the fan 20 correspondingly decreases the rotation speed. When the rotation speed is less than the critical speed, the air volume of the fan 20 decreases and no longer boosts pressure. The deflation speed of the airbag 30 is greater than the inflation speed, causing that the air of the airbag 30 slowly flows out until the airbag 30 is deflated, and the storing process is complete. Meanwhile, the case 14 returns back to the position on the main body 12 horizontally.

The boost timing of the fan 20 rotating at a speed greater than the critical speed may be set according to the BIOS preset heat dissipation temperature (the temperature of a laptop generally ranges from 55° C. to 60° C.) to keep the device operating at the best condition. In other words, when the temperature of the main body 12 is greater than 55° C., the fan 20 rotates at a speed greater than the critical speed. Moreover, taking a laptop for example, the weight of the keyboard is about 200 g so the required air volume for the fan 20 is limited as long as the volume allows the airbag 30 to lift the case 14 (where the keyboard is disposed) and expose the gap 15.

Figure 5:
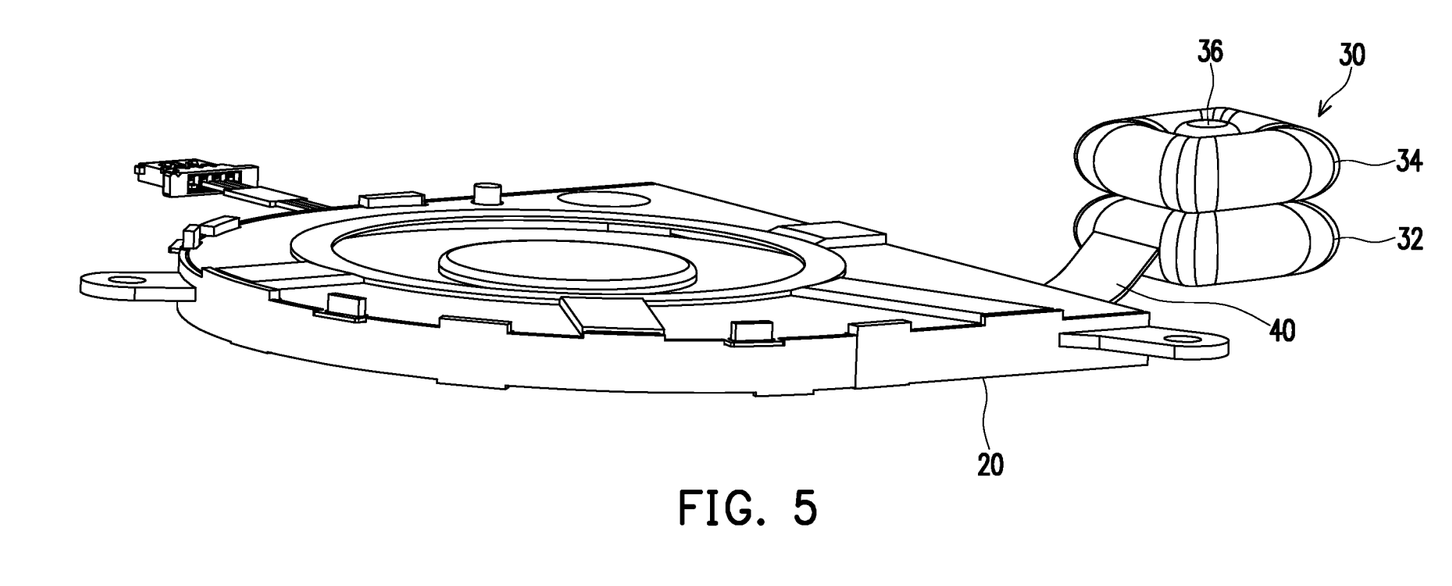
FIG. 5 is a schematic view of a fan, an airbag, and an air conveyor belt of the electronic device of FIG. 1.
Figure 6:
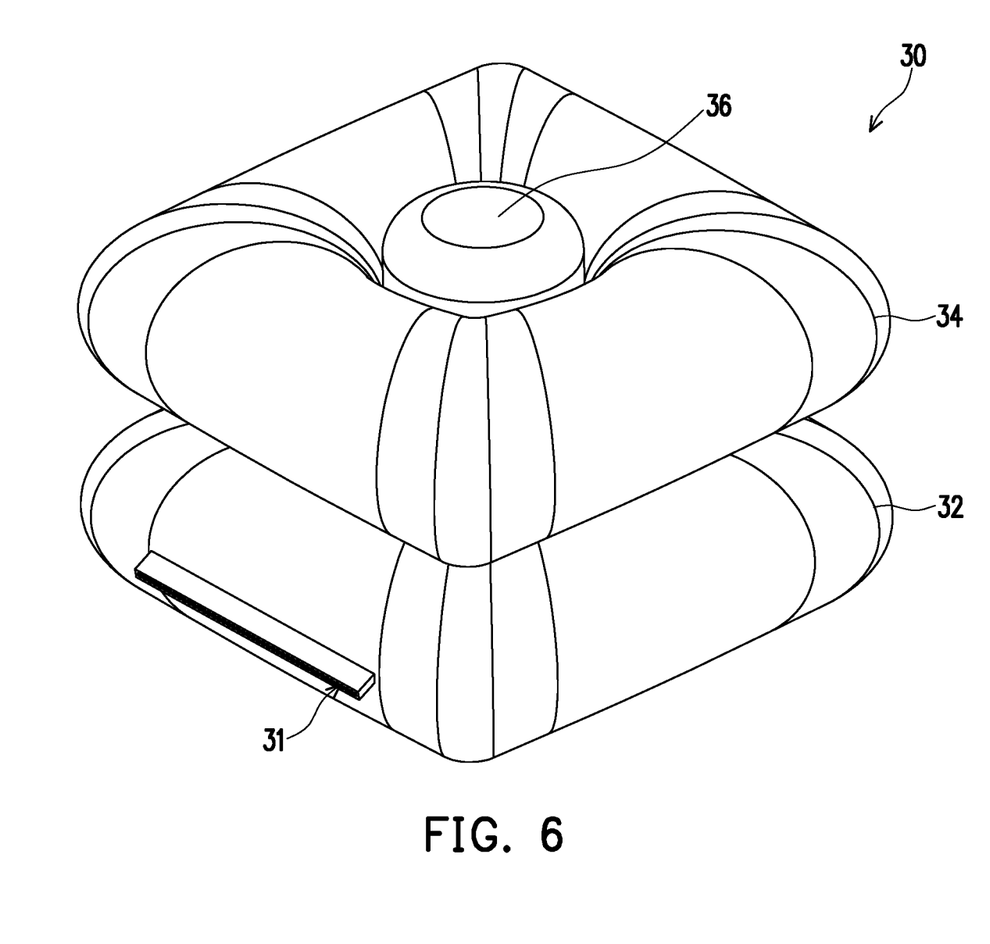
FIG. 6 is an enlarged schematic view of the airbag of the electronic device of FIG. 1.
Figure 7:
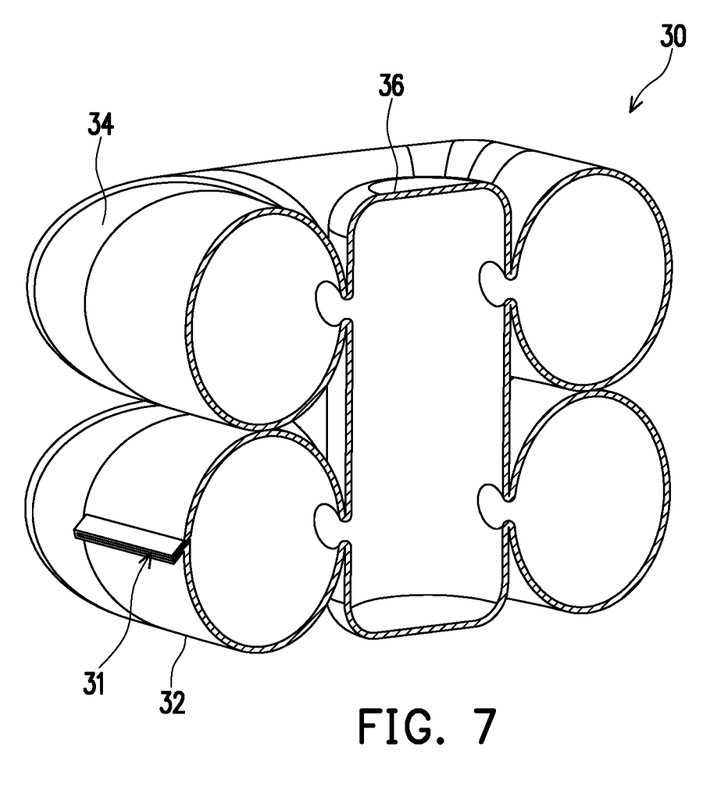
FIG. 7 is a schematic cross-sectional view of FIG. 6.

FIG. 5 is a schematic view of a fan, an airbag, and an air conveyor belt of the electronic device of FIG. 1. FIG. 6 is an enlarged schematic view of the airbag of the electronic device of FIG. 1. FIG. 7 is a schematic cross-sectional view of FIG. 6. Referring to FIG. 5 to FIG. 7, in the embodiment, the electronic device 10 further includes an air conveyor belt 40 connected between the air inlet valve 31 of the airbag 30 and the fan 20. The wind of the fan 20 is transmitted to the airbag 30 through the air conveyor belt 40. The airbag 30 includes ring structures 32 and 34 with multiple layers, and the multiple layers of the ring structures 32 and 34 are interconnected with one another. The design of the multiple layers for the ring structures 32 and 34 is adapted to control the opening and storage directions of the airbag 30.

Moreover, the airbag 30 further includes a center structure 30 disposed in the ring structures 32 and 34 with the multiple layers, and the multiple layers of the ring structures 32 and 34 are interconnected with the center structure 36. The center structure 36 is adapted to supplement the strength of the ring structures 32 and 34 at the central position, so as to prevent the overall shape of the airbag 30 from being uneven or having insufficient supporting strength. As shown in FIG. 7, the air inlet valve 31 is interconnected with the ring structures 32 and 34 with multiple layers, and the multiple layers of the ring structures 32 and 34 are interconnected with the center structure 36. When air enters through the air inlet valve 31, it simultaneously fills the multiple layers of the ring structures 32 and 34 and the center structure 36, so that the airbag 30 is quickly inflated.

Furthermore, in the embodiment, the material of the airbag 30 includes a heat-resistant material to prevent abnormality in use due to the high temperature. In addition, in the embodiment, the material of the airbag 30 is an insulating material. Therefore, the short circuit issues with electronic components are effectively prevented, and neither electromagnetic interference nor electromagnetic effects on the magnetic ring of the magnetic structure are caused.

In the embodiment, the airbag 30 adopts the structure of the air inlet valve 31 to control the inflation and deflation. The design of the air inlet valve 31 prevents the turbulence caused by the backflow of air, and whether the air inlet valve 31 is opened or shut is due to the inflation and the deflation of the airbag 30 which is controlled by the pressure boosting of the fan 20 when the temperature rises. When the wind pressure of the fan 20 increases, the airbag 30 is inflated quickly. Moreover, the size of the air inlet valve 31 of the airbag 30 also controls the deflation speed and prevents collisions when the structure collapses due to rapid deflation.

Figure 8:
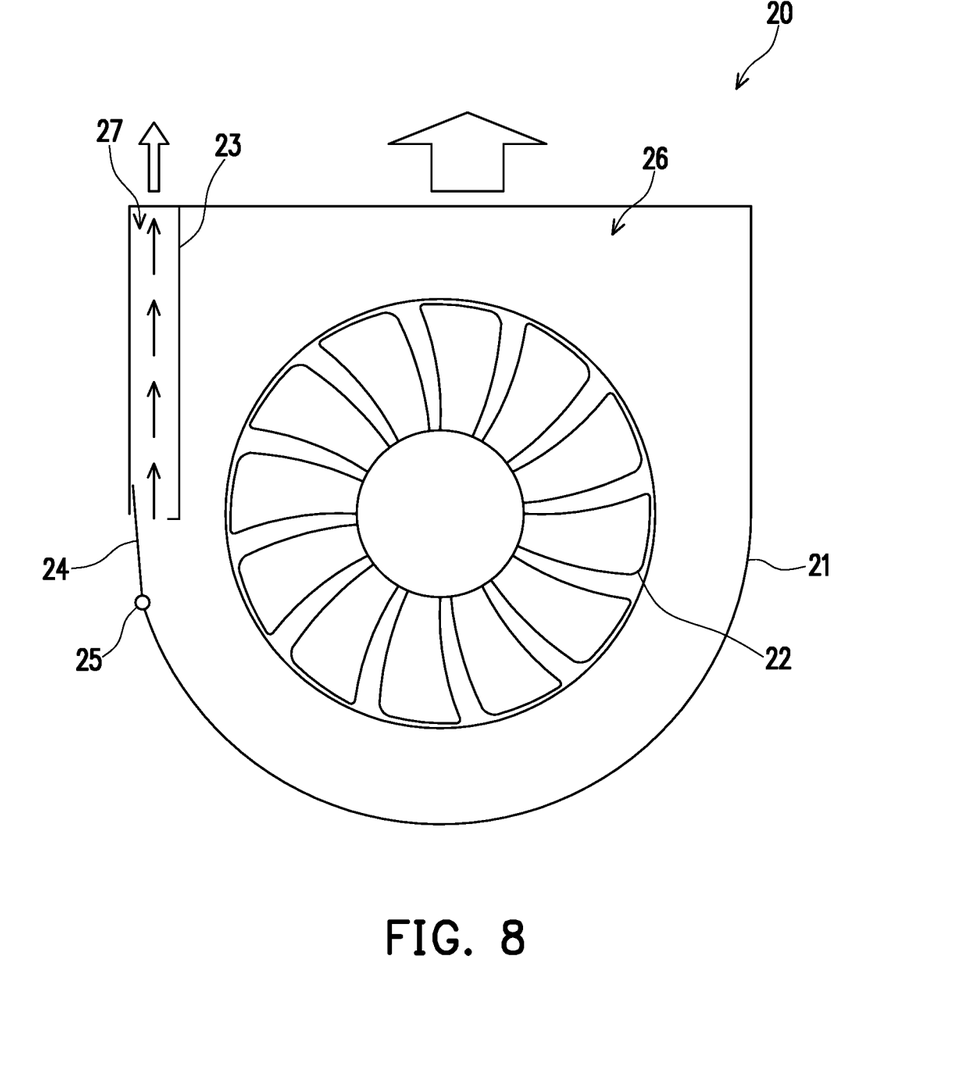
FIG. 8 is a schematic view of the fan of the electronic device of FIG. 1 when the fan is inflating the airbag.

FIG. 8 is a schematic view of the fan of the electronic device of FIG. 1 when the fan is inflating the airbag. Referring to FIG. 8 first, in the embodiment, the fan 20 includes a retaining wall 23 and a primary channel 26 and a secondary channel 27 separated by the retaining wall. The airbag 30 is interconnected with the secondary channel 27. When the fan 20 is operating, a fan blade 22 rotates to generate airflow, and the airflow mostly flows out from the primary channel 26 and blows toward the heat source. A small part of the airflow flows out from the secondary channel 27 and flows through the air conveyor belt 40 (see FIG. 5), and finally goes into the airbag 30.

The fan 20 further includes a housing 21 and a door panel 24 pivotally connected to the housing 21. The door panel 24 is pivotally connected to the housing 21 through a rotating shaft 25, and the door panel 24 is disposed beside the secondary channel 27. Under normal operating conditions, the door panel 24 abuts the housing 21 and makes room, so that a part of the airflow generated by the rotation of the fan blade 22 flows to the secondary channel 27.

Figure 9:
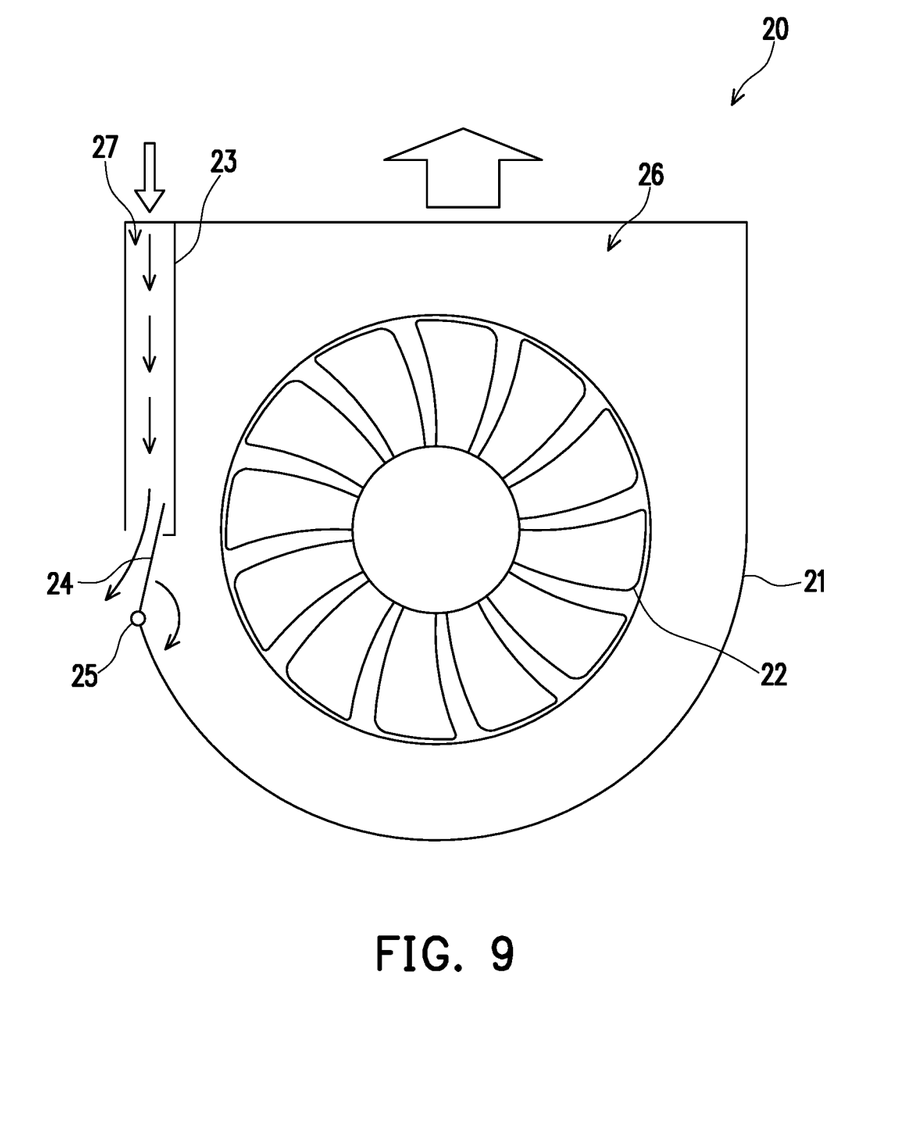
FIG. 9 is a schematic view of the fan when the airbag of the electronic device of FIG. 1 is being deflated.

FIG. 9 is a schematic view of the fan when the airbag of the electronic device of FIG. 1 is being deflated. Referring to FIG. 9 first, in the embodiment, when the airbag 30 is deflated, the door panel 24 is opened so that the airflow from the airbag 30 flows into the secondary channel 27 of the fan 20 in the reverse direction and flows out from the opening between the door panel 24 and the housing 21. The door panel 24 is automatically opened through the push of the airflow. In an embodiment, the door panel 24 may be opened by electric means.

Based on the above, in the electronic device of the disclosure, the airbag is disposed in the accommodation space below the orthographic projection of the case and is connected to the fan. When the fan rotates at a speed less than the critical speed, the fan is capable of reaching sufficient heat dissipation, the air bag has not been inflated, and the case horizontally covers the opening. When the fan rotates at a speed greater than the critical speed, the airbag is inflated by the fan to lift a side of the case, so that the case is tilted on the main body to expose the opening. Meanwhile, the gap between the opening and the case and the main body serves as the inlet and outlet of the airflow to help the outflow of high-temperature air, or the entry of the external cold air for cooling.

What is claimed is:

1. An electronic device comprising:
   a main body with an accommodation space and an opening, wherein the main body comprises a fan disposed in the accommodation space;
   a case disposed on the opening, wherein one side of the case is connected to one of side walls of the main body surrounding the opening, and the accommodation space is below an orthographic projection of the case; and
   an airbag disposed in the accommodation space and connected with the fan, wherein when the airbag is not yet inflated, the case horizontally covers the opening, and
   when the fan rotates at a speed greater than a critical speed, the airbag is inflated by the fan and lifts another side of the case, so that the case is tilted on the main body, and the opening is exposed.

2. The electronic device according to claim 1, wherein the airbag comprises a ring structures with multiple layers, and the multiple layers are interconnected to one another.

3. The electronic device according to claim 2, wherein the airbag comprises a center structure disposed in the ring structures with the multiple layers, and the multiple layers are interconnected to the center structure.

4. The electronic device according to claim 1, wherein the fan comprises a retaining wall, a primary channel and a secondary channel separated by the retaining wall, and the airbag communicates with the secondary channel.

5. The electronic device according to claim 4, wherein the fan further comprises a housing and a door panel pivotally connected to the housing, the door panel is disposed beside the secondary channel, and the door panel is adapted to be opened to allow air from the airbag to flow out when the airbag is deflated.

6. The electronic device according to claim 1, wherein when the case is tilted on the main body to expose the opening, airflow of the fan flows out of the opening.

7. The electronic device according to claim 1, wherein the airbag comprises an air inlet valve, and the electronic device further comprises an air conveyor belt connected between the air inlet valve of the airbag and the fan.

8. The electronic device according to claim 1, further comprising a secondary body pivotally connected to the main body, wherein when the secondary body is closed on the main body, the case covers the opening.

9. The electronic device according to claim 1, wherein a material of the airbag comprises a heat-resistant material.

10. The electronic device according to claim 1, wherein a material of the airbag is an insulating material.

11. The electronic device according to claim 1, wherein when a temperature of the main body is greater than 55° C., the fan rotates at a speed greater than the critical speed.

* * * * *